(12) United States Patent
Weng et al.

(10) Patent No.: US 7,235,491 B2
(45) Date of Patent: Jun. 26, 2007

(54) METHOD OF MANUFACTURING SPACER

(75) Inventors: Chun-Jen Weng, Tainan (TW);
Chia-Jui Liu, Taoyuan County (TW)

(73) Assignee: United Microelectronics Corp.,
Hsinchu (TW)

( * ) Notice: Subject to any disclaimer, the term of this patent is extended or adjusted under 35 U.S.C. 154(b) by 87 days.

(21) Appl. No.: 10/908,240

(22) Filed: May 4, 2005

(65) Prior Publication Data

US 2006/0252190 A1 Nov. 9, 2006

(51) Int. Cl.
*H01L 21/302* (2006.01)
(52) U.S. Cl. .................. 438/704; 438/706; 438/303
(58) Field of Classification Search ........... 438/303, 438/304, 305, 595, 706, 704, 734
See application file for complete search history.

(56) References Cited

U.S. PATENT DOCUMENTS 7,098,138 B2* 8/2006 Arase et al. ............ 438/706
2004/0157397 A1* 8/2004 Quek ..................... 438/305
2005/0118770 A1* 6/2005 Nandakumar et al. ...... 438/305
2005/0130434 A1* 6/2005 Chien et al. ............. 438/706
2005/0181590 A1* 8/2005 Chiu et al. .............. 438/595
2005/0227446 A1* 10/2005 Kao et al. ............... 438/305
2005/0282344 A1* 12/2005 Jin et al. ................ 438/300
2006/0141719 A1* 6/2006 Jung .................... 438/299
2006/0157750 A1* 7/2006 Kim et al. ............... 257/288
2006/0189065 A1* 8/2006 Wang et al. ............ 438/216

* cited by examiner

*Primary Examiner*—Thao P. Le
(74) *Attorney, Agent, or Firm*—Jianq Chyun IP Office

(57) ABSTRACT

A method of manufacturing a spacer for a substrate having a gate structure formed thereon. The method comprises steps of forming a first oxide layer over the substrate and forming a nitride layer on the first oxide layer. A first asymmetric etching process is performed to remove a portion of the nitride layer until a portion of a top surface of the first oxide layer is exposed. A second asymmetric etching process is performed to remove a portion of the first oxide layer by using the remaining nitride layer as a mask until about 50% to 90% portion of the first oxide layer is removed. A quick wet etching process is performed to remove a portion of the remaining first oxide located on the top of the gate structure and on the substrate.

7 Claims, 2 Drawing Sheets

METHOD OF MANUFACTURING SPACER

BACKGROUND OF THE INVENTION

1. Field of Invention

The present invention relates to a method of manufacturing a semiconductor device. More particularly, the present invention relates to a method of manufacturing a spacer.

2. Description of Related Art

When the integration of the integrated circuit is getting increased, the size of the semiconductor device is decreased. Therefore, the length of the channel in the substrate under the gate structure is also decreased. However, when the length of the channel is shrinking into a certain level, the problems caused by relatively short channel length happen. That is so-called Short Channel Effect. Currently, the Lightly-Doped-Drain (LDD) design is the most common way to solve the Short Channel Effect. In this kind of design, a lightly doped source/drain region is further formed in the substrate closely adjacent to the channel between the original source/drain region of the metal oxide semiconductor (MOS).

Under the LDD design, a spacer is required to form on the sidewall of the gate structure. Conventionally, the spacer is made of silicon oxide. Nevertheless, the material of silicon oxide possesses the characteristic of absorbing moisture. Recently, an oxide-nitride-oxide material is used to form the spacer. FIG. 1 is a cross-sectional view showing a gate structure having an oxide-nitride-oxide spacer. As shown in FIG. 1, a gate structure 102 having a spacer structure 104 is located on a substrate 100. The gate structure 102 comprises a gate dielectric layer 102a and a gate electrode 102b. The spacer structure 104 comprises a bottom oxide spacer 106, a middle L-shape nitride spacer 108 and an upper oxide spacer 110. Because of the wet etching process for removing a portion of the bottom oxide layer until the bottom oxide spacer 106 is formed, an under-cut phenomenon 112 happens on the bottom oxide spacer 106 under the middle L-shape nitride spacer 108. As a result, it is not easy to control the actual lateral length of the MOS. Therefore, the margin of the later formed source/drain region (not shown) in the substrate 100 by performing an ion implantation process cannot be well controlled and the uncertain margin of the source/drain region leads to unexpected electrical performance of the semiconductor device. Further, the reliability of the semiconductor device is decreased as well.

SUMMARY OF THE INVENTION

Accordingly, at least one objective of the present invention is to provide a method of manufacturing a spacer capable of well controlling the length of the spacer. As a result, the electrical performance of the later formed semiconductor device is well controlled and the reliability of the semiconductor device is increased.

At least another objective of the present invention is to provide a method of patterning an oxide layer formed under a patterned nitride layer over a substrate. By using the method, the sidewall profile of the post-etching oxide layer can be well controlled.

To achieve these and other advantages and in accordance with the purpose of the invention, as embodied and broadly described herein, the invention provides a method of manufacturing a spacer for a substrate having a gate structure formed thereon. The method comprises steps of forming a first oxide layer over the substrate and forming a nitride layer on the first oxide layer. A first asymmetric etching process is performed to remove a portion of the nitride layer until a portion of a top surface of the first oxide layer is exposed. A second asymmetric etching process is performed to remove a portion of the first oxide layer by using the remaining nitride layer as a mask until about 50% to 90% portion of the first oxide layer is removed. A quick wet etching process is performed to remove a portion of the remaining first oxide located on the top of the gate structure and on the substrate.

In the present invention, after the step of forming the first oxide layer and before the step of performing the first asymmetric etching process, the method further comprises steps of forming a second oxide layer on the nitride layer and performing a third asymmetric etching process to remove a portion of the second oxide layer until a portion of the nitride layer over the substrate and the gate structure is exposed. Moreover, the quick wet etching process comprises a step of dipping the substrate into a wet etching tank containing an etchant and the etchant can be a solution comprising dilute hydrofluoric acid, ammonia, hydrogen peroxide and water.

The present invention also provides a method of patterning an oxide layer for a substrate having an oxide layer and a patterned nitride layer formed thereon successively, wherein the patterned nitride layer exposes a portion of the oxide layer. The method comprises steps of performing an asymmetric etching process to remove 50% to 90% portion of the oxide layer exposed by the patterned nitride layer and performing a quick wet etching process until the remaining oxide layer is removed.

In the present invention, the quick wet etching process comprises a step of dipping the substrate into a wet etching tank containing an etchant and the etchant can be a solution comprising dilute hydrofluoric acid, ammonia, hydrogen peroxide and water.

During the process of removing a portion of the oxide layer exposed by the patterned nitride layer, since the asymmetric etching process is performed followed by the quick wet etching process and 50% to 90% portion of the oxide layer is previously removed in the asymmetric etching process, the under cut phenomenon on the oxide layer can be successfully suppressed. As a result, the lateral length of the spacer structure or the sidewall profile of the oxide layer can be well controlled and the electrical performance of the later formed semiconductor device can be well controlled as well. Therefore, the reliability of the semiconductor device is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
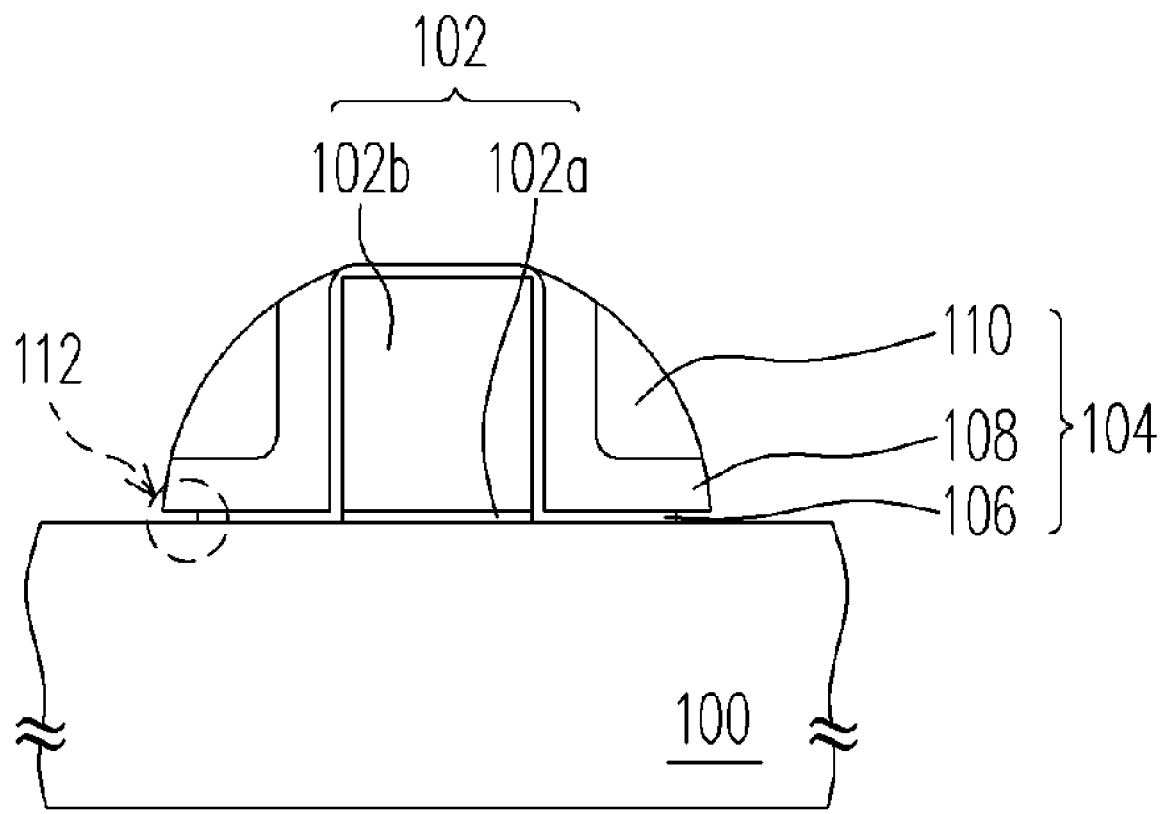
FIG. 1 is a cross-sectional view showing a gate structure having an oxide-nitride-oxide spacer.
Figure 2A:
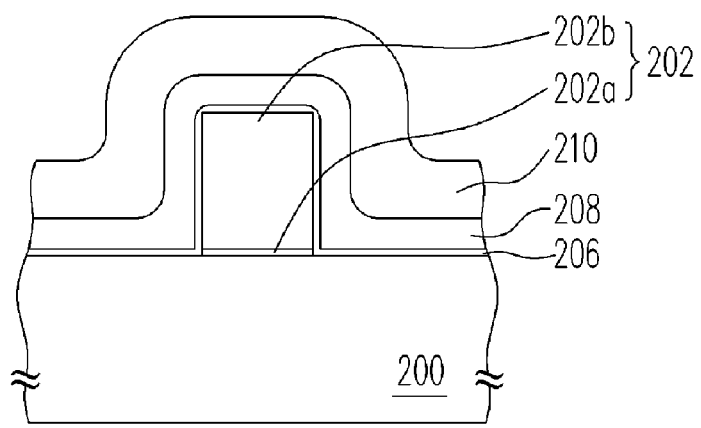
FIGS. 2A through FIG. 2C are cross-sectional views illustrating a method of manufacturing a spacer according to one of the preferred embodiments of the present invention.
Figure 2B:
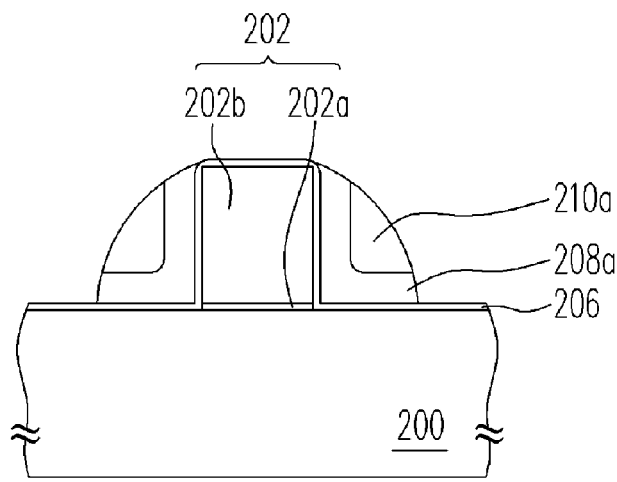
Figure 2C:
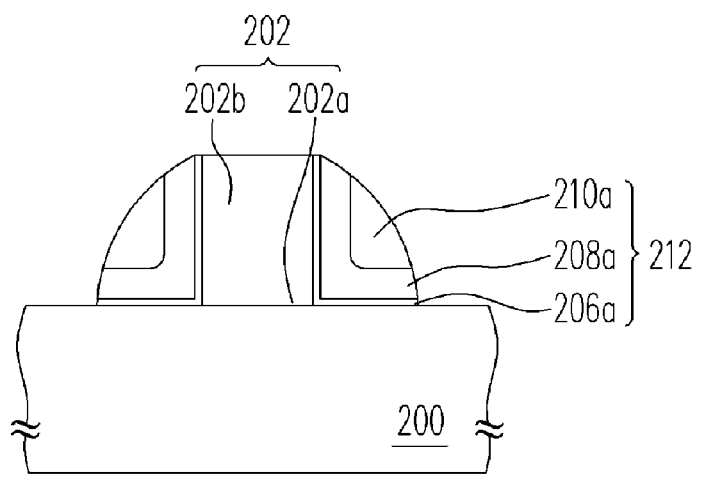

FIGS. 2A through FIG. 2C are cross-sectional views illustrating a method of manufacturing a spacer according to one of the preferred embodiments of the present invention. As shown in FIG. 2A, a substrate 200 having a gate structure 202 formed thereon is provided. The gate structure 202 includes a gate dielectric layer 202a located on the substrate 200 and a gate electrode 202b located on the gate dielectric layer 202a. The gate structure 202 can further possess an offset spacer (not shown) formed on the sidewall of the gate structure 202. The offset spacer can be composed of a oxide liner and a thin nitride spacer. Thereafter, an oxide layer 206 is formed over the substrate 200. The oxide layer 206 can be, for example, formed by atmospheric chemical vapor deposition (APCVD), low pressure chemical vapor deposition (LPCVD) or plasma-enhanced chemical vapor deposition (PECVD). Then, a nitride layer 208 is formed on the oxide layer 206. The nitride layer 208 can be, for example, formed by atmospheric chemical vapor deposition (APCVD), low pressure chemical vapor deposition (LPCVD) or plasma-enhanced chemical vapor deposition (PECVD). Further, an oxide layer 210 is formed on the nitride layer 208.

As shown in FIG. 2B, an asymmetric etching process is performed to remove a portion of the oxide layer 210 until a portion of the nitride layer 208 (shown in FIG. 2A) over the substrate 200 and the gate structure 202 is exposed. The asymmetric etching process can be a dry etching process. In addition, the asymmetric etching process is performed under a chamber pressure of about 30 mTorr and the etchant used in the asymmetric etching process can be, for example, a gas mixture including $C_4F_8$, carbon monoxide, argon and oxygen with a composition proportion of about 40:85:1000:30. Therefore, the oxide layer 210 is transformed into an oxide spacer 210a.

Then, an asymmetric etching process is performed to remove a portion of the nitride layer 208 exposed by the oxide spacer 210a until a portion of the oxide layer 206 over the substrate 200 and the gate structure 202 is exposed. Therefore, the nitride layer 208 is transformed into an L-shape nitride spacer 208a. The asymmetric etching process can be, for example, a dry etching process. The asymmetric etching process is performed under a chamber pressure of about 60 mTorr and the etchant used in the asymmetric etching process can be, for example, a gas mixture including carbon dioxide and methyl fluoride with a composition proportion of about 180:60.

As shown in FIG. 2C, an asymmetric process is performed to remove 50% to 90% portion of the oxide layer 206. The asymmetric process can be, for example, a dry etching. The asymmetric process can be, for example, performed under a chamber pressure of about 10 mTorr and the etchant can be, for example, a gas mixture including hexafluoroethane ($C_2F_6$), difluoromethane, oxygen and helium with a composition proportion of about 30:90:20: 200. Furthermore, the etching ration of silicon oxide to silicon with respect to the etchant is about of 8.

Moreover, a quick wet etching process is performed to remove a portion of the remaining oxide layer on the substrate 200 and the gate structure 202 exposed by the oxide spacer 210a and the L-shape nitride spacer 208a. Therefore, a spacer structure 212 comprising the oxide spacer 210a, the L-shape nitride spacer 208a and a bottom oxide spacer 206a is formed. Notably, the quick wet etching process comprises a step of slightly dipping the substrate 200 into a wet etching tank (not shown) containing an etchant. The etchant can be, for example, a solution including dilute hydrofluoric acid, ammonia, hydrogen peroxide and water.

During the process of removing a portion of the oxide layer 206 exposed by the oxide spacer 210a and the L-shape nitride spacer 208a, since the asymmetric etching process is performed followed by the quick wet etching process and 50% to 90% portion of the oxide layer 206 is previously removed in the asymmetric etching process, the under cut phenomenon on the bottom oxide spacer 206a can be successfully suppressed. As a result, the lateral length of the spacer structure can be well controlled and the electrical performance of the later formed semiconductor device can be well controlled as well. Therefore, the reliability of the semiconductor device is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method of manufacturing a spacer for a substrate having a gate structure formed thereon, comprising:
    forming a first oxide layer over the substrate;
    forming a nitride layer on the first oxide layer;
    performing a first asymmetric etching process to remove a portion of the nitride layer until a portion of a top surface of the first oxide layer is exposed; and
    performing a second asymmetric etching process to remove a portion of the first oxide layer by using the remaining nitride layer as a mask until about 50% to 90% portion of the first oxide layer is removed, and then performing a quick wet etching process to remove a portion of the remaining first oxide layer located on the top of the gate structure and on the substrate such that under cut phenomenon is prevented from occurring to the first oxide layer.

2. The method of claim 1, after the step of forming the first oxide layer and before the step of performing the first asymmetric etching process, further comprising steps of:
    forming a second oxide layer on the nitride layer; and
    performing a third asymmetric etching process to remove a portion of the second oxide layer until a portion of the nitride layer over the substrate and the gate structure is exposed.

3. The method of claim 1, wherein the quick wet etching process comprises a step of dipping the substrate into a wet etching tank containing an etchant.

4. The method of claim 3, wherein the etchant can be a solution comprising dilute hydrofluoric acid, ammonia, hydrogen peroxide and water.

5. A method of patterning an oxide layer for a substrate having an oxide layer and a patterned nitride layer formed thereon successively, wherein the patterned nitride layer exposes a portion of the oxide layer, the method comprising:

performing an asymmetric etching process to remove 50% to 90% portion of the oxide layer exposed by the patterned nitride layer, and then performing a quick wet etching process until the remaining oxide layer is removed such that under cut phenomenon is prevented from occurring to the oxide layer.

6. The method of claim 5, wherein the quick wet etching process comprises a step of dipping the substrate into a wet etching tank containing an etchant.

7. The method of claim 6, wherein the etchant can be a solution comprising dilute hydrofluoric acid, ammonia, hydrogen peroxide and water.

* * * * *